US008728888B2

(12) United States Patent
Iida et al.

(10) Patent No.: US 8,728,888 B2
(45) Date of Patent: May 20, 2014

(54) MANUFACTURING METHOD OF SEMICONDUCTOR STORAGE DEVICE

(71) Applicant: Kabushiki Kaisha Toshiba, Tokyo (JP)

(72) Inventors: Naoyuki Iida, Yokkaichi (JP); Satoshi Nagashima, Yokkaichi (JP); Nagisa Takami, Yokkaichi (JP); Hidefumi Mukai, Mie-Gun (JP); Yoshihiro Yanai, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/795,024

(22) Filed: Mar. 12, 2013

(65) Prior Publication Data

US 2014/0065812 A1  Mar. 6, 2014

(30) Foreign Application Priority Data

Sep. 6, 2012 (JP) ................................. 2012-196666

(51) Int. Cl.
*H01L 21/336* (2006.01)

(52) U.S. Cl.
USPC ........... 438/257; 438/201; 438/211; 438/288; 438/593; 257/E21.422

(58) Field of Classification Search
USPC ......... 438/201, 211, 257–258, 266, 288, 593; 257/E21.422
See application file for complete search history.

(56) References Cited

U.S. PATENT DOCUMENTS

| 7,687,387 | B2 | 3/2010 | Inaba et al. | |
| 8,158,333 | B2 | 4/2012 | Hashimoto | |
| 2007/0238053 | A1 | 10/2007 | Hashimoto | |
| 2009/0050951 | A1 | 2/2009 | Inaba et al. | |
| 2010/0210111 | A1* | 8/2010 | Tran et al. | 438/697 |
| 2010/0221665 | A1 | 9/2010 | Hashimoto | |

FOREIGN PATENT DOCUMENTS

| JP | 2007-305970 A | 11/2007 |
| JP | 2009-49338 A | 3/2009 |
| JP | 2010-245173 A | 10/2010 |

* cited by examiner

*Primary Examiner* — Thanhha Pham
(74) *Attorney, Agent, or Firm* — Oblon, Spivak, McClelland, Maier & Neustadt, L.L.P.

(57) ABSTRACT

In a manufacturing method, gate electrode materials and a hard-mask material are deposited above a substrate. First mandrels are formed on the hard-mask material in a region of cell array. A second mandrel is formed on the hard-mask material in a region of a selection gate transistor. First sidewall-masks are formed on side-surfaces of the first mandrels. A second sidewall-mask is formed on a side-surface of the second mandrel. An upper side-surface of the second sidewall-mask is exposed. A sacrificial film is embedded between the first sidewall-masks. A sacrificial spacer is formed on the upper side-surface of the second sidewall-mask. A resist film covers the second mandrel. An outer edge of the resist film is located between the first mandrel closest to the second mandrel and the sacrificial spacer. The first mandrels are removed using the resist film as a mask. And, the sacrificial film and spacer are removed.

9 Claims, 8 Drawing Sheets

MANUFACTURING METHOD OF SEMICONDUCTOR STORAGE DEVICE

CROSS REFERENCE TO RELATED APPLICATIONS

This application is based upon and claims the benefit of priority from the prior Japanese Patent Application No. 2012-196666, filed on Sep. 6, 2012, the entire contents of which are incorporated herein by reference.

FIELD

The embodiments of the present invention relate to manufacturing method of a semiconductor device.

BACKGROUND

In a semiconductor storage device such as a NAND EEPROM, selection gate transistors are provided on both ends of a memory cell array so as to select memory cells, conventionally. A hard mask used to form each gate electrode of the memory cells is processed while using a sidewall as a mask (a sidewall transfer method). Meanwhile, a hard mask used to form each gate electrode of the selection gate transistors is processed while using a resist film according to a lithography technique as a mask. In the lithography technique, it is necessary to design the space width between each selection gate transistor and the memory cell array to be larger than a distance between the memory cells so as to secure an alignment margin.

However, if the space width between each selection gate transistor and the memory cell array is large, a phenomenon (substrate gouging) occurs that a semiconductor substrate is gouged in a space area between the selection gate transistor and the memory cell array at the time of processing the gate electrodes of the selection gate transistors and the memory cells by RIE (Reactive Ion Etching).

Such substrate gouging causes an increase in resistances of diffusion layers in the space area between the selection gate transistor and the memory cell array and reduction in a cell current. Furthermore, if the space width between the selection gate transistor and the memory cell array is large, there is also a problem that a chip size increases.

DETAILED DESCRIPTION

In a manufacturing method of a semiconductor storage device according to the present invention, the device includes a plurality of memory cells and a selection gate transistor provided on each end of a memory cell array including the memory cells. Gate electrode materials of the memory cells and the selection gate transistor are deposited above a semiconductor substrate. A hard mask material is deposited on the gate electrode materials. First mandrels are formed on the hard mask material in a region of the memory cell array, and a second mandrel is formed on the hard mask material in a region of the selection gate transistor. First sidewall masks are formed on side surfaces of the respective first mandrels in order to form the first sidewall masks into patterns of gate electrodes of the memory cells, and a second sidewall mask is formed on a side surface of the second mandrel in order to form the second sidewall mask on a part of a gate electrode of the selection gate transistor. An upper portion of the second mandrel is removed in order to expose an upper side surface of the second sidewall mask. A sacrificial film is embedded in a gap between the first sidewall masks adjacent to each other, and a sacrificial spacer is formed on the upper side surface of the second sidewall mask. A resist film is formed so as to cover the second mandrel. An outer edge of the resist film is located in a region between one of the first mandrels closest to the second mandrel and the sacrificial spacer. The first mandrels are removed by using the resist film as a mask. And, the sacrificial film and the sacrificial spacer are removed.

Embodiments will now be explained with reference to the accompanying drawings. The present invention is not limited to the embodiment. In the following explanations, a term referring to a direction such as an upper direction or a lower direction indicates a relative direction when a surface of a semiconductor substrate on which memory cells MC are provided is assumed as "upper surface". Accordingly, the upper direction or the lower direction often differs from a vertical direction based on a gravitational acceleration direction.

First Embodiment

Figure 1:
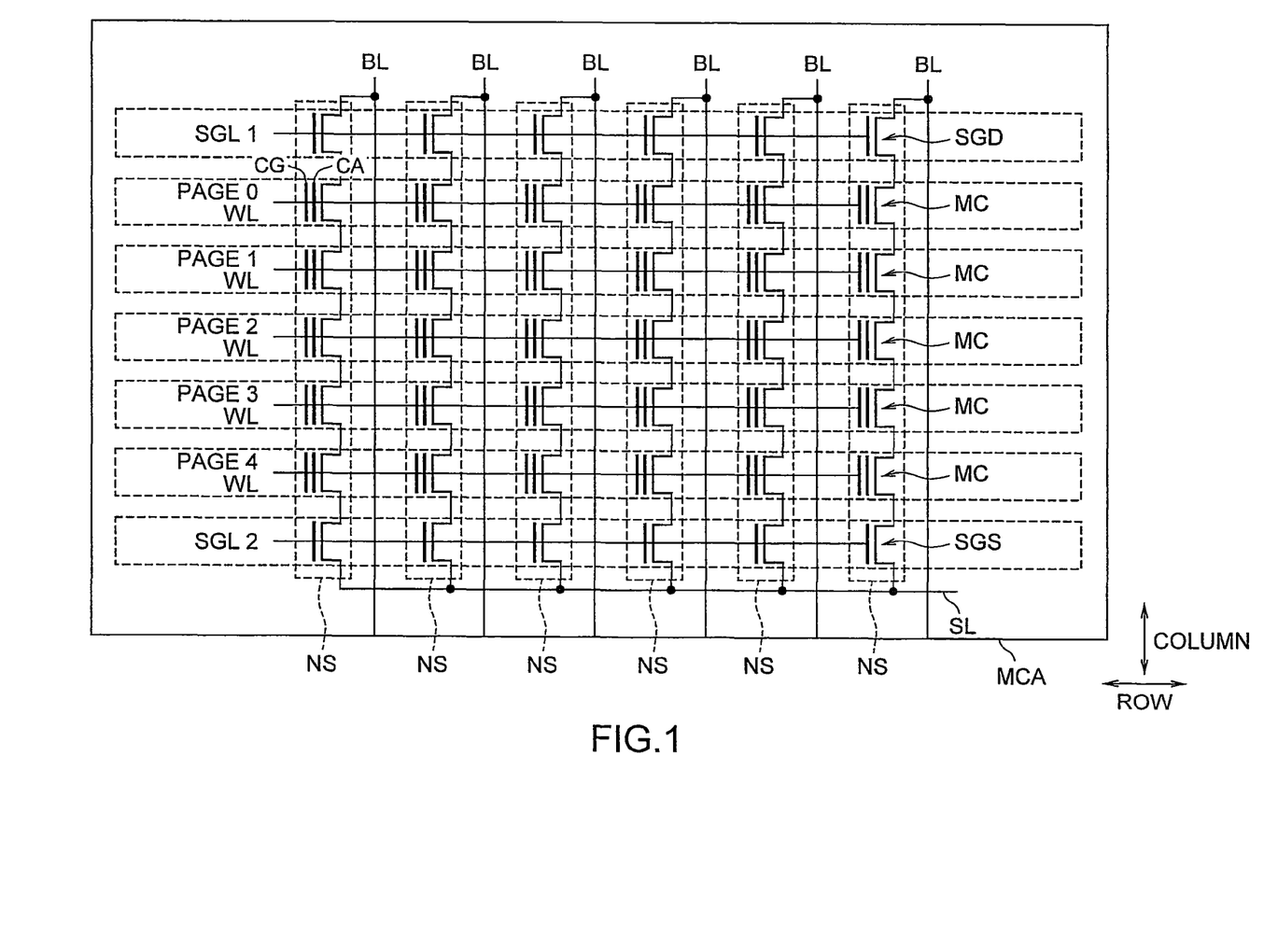
FIG. 1 is a configuration diagram of an example of a memory cell array MCA in a NAND flash EEPROM according to an embodiment.

FIG. 1 is a configuration diagram of a memory cell array MCA in a NAND flash EEPROM according to an embodiment. The memory cell array MCA includes a plurality of NAND strings NS connected to bit lines BL in respective columns. Each of the NAND strings NS includes a plurality of memory cells MC and selection gate transistors SGS and SGD. The memory cells MC are connected in series. The selection gate transistors SGS and SGD are connected to both ends of a string of these memory cells MC, respectively. In this example, five memory cells MC are connected in series in each NAND string NS. Generally, 32 or 64 memory cells MC are connected in series per NAND string NS. One end of the NAND string NS is connected to the corresponding bit line BL and the other end thereof is connected to a common source line SL. FIG. 1 shows one of memory cell blocks in units of which data can be erased in the memory cell array MCA. Normally, the memory cell array MCA includes a plurality of memory cell blocks shown in FIG. 1.

A control gate CG of each memory cell MC is connected to a word line WL on a page to which the memory cell MC belongs. Gates of the selection gate transistors SGD and SGS are connected to the selection gate transistors SGL1 and SGL2, respectively. The "page" is a unit of data reading or data writing.

A plurality of word lines WL extend in a row direction, and a plurality of bit lines BL extend in a column direction substantially orthogonal to the row direction.

As shown in FIG. 1, the memory cells MC are provided to correspond to grid-like intersections constituted by the word lines WL and the bit lines BL, respectively. While the memory cell array MCA (memory cell block) in the present embodiment includes 5×6 (=30) memory cells MC, the number of memory cells MC per block is not limited to 30.

An n-FET (Field-Effect Transistor) including a charge accumulation layer CA and the control gate CG can be used as each memory cell MC. By applying a voltage to the control gate CG from one word line WL, electric charges (electrons)

are injected into or discharged from the charge accumulation layer CA. With this configuration, data can be written to or erased from the memory cell MC. The memory cell MC has a threshold voltage in proportion to the number of electric charges (electrons) accumulated in the charge accumulation layer CA. The memory cell MC can electrically store binary data (one bit) or multilevel data (two or more bits), depending on the threshold voltage. In this way, a charge-accumulation nonvolatile memory can be used as the memory cell MC.

Figure 2:
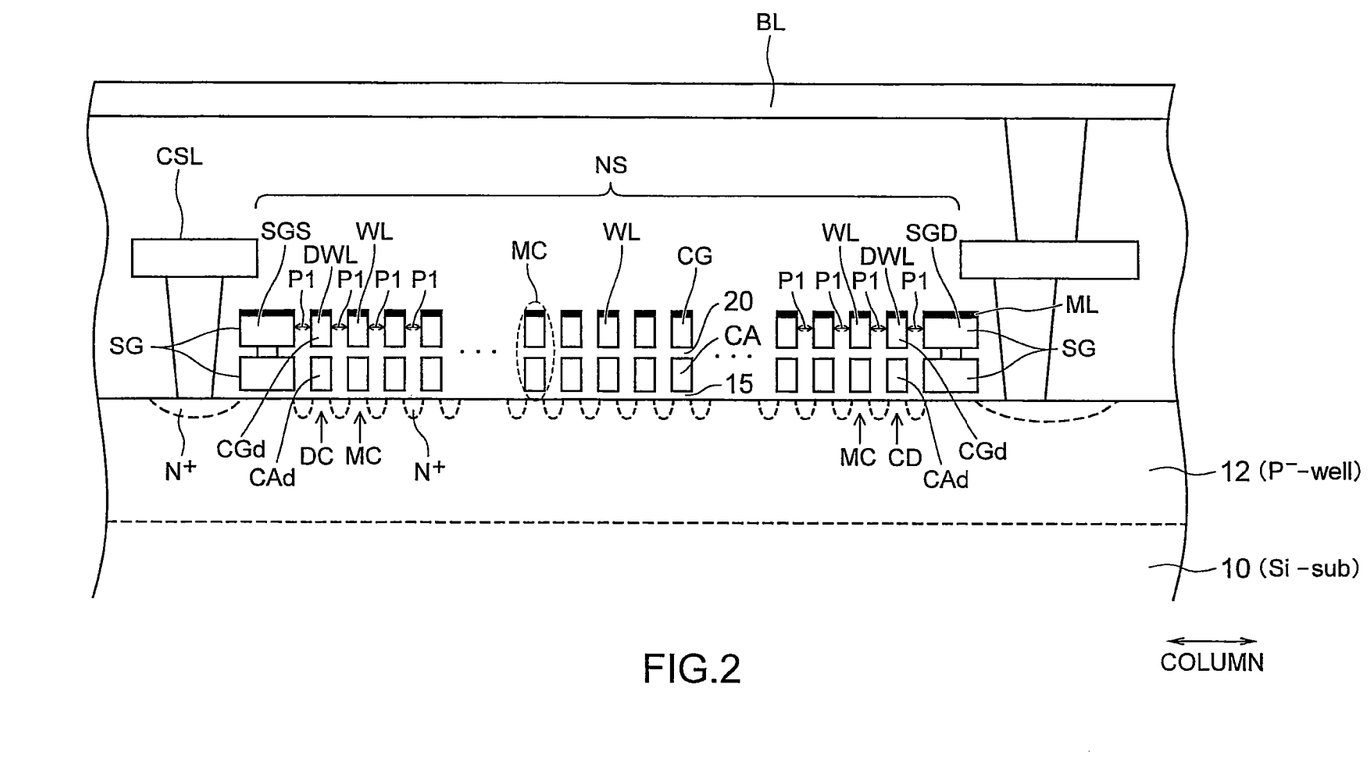
FIG. 2 is a cross-sectional view of an example of a NAND string NS.

FIG. 2 is a cross-sectional view of a NAND string NS. The NAND string NS is formed on a P-well 12 formed in a silicon substrate 10. A cell source line CSL is connected to the source-side selection gate transistor SGS connected to a source side of the NAND string NS. In contrast, each bit line BL is connected to a drain-side selection gate transistor SGD connected to a drain side of the NAND string NS.

A plurality of memory cell MC adjacent in the column direction share an $n^+$ diffusion layer, whereby the memory cells MC are connected in series between the selection gate transistors SGD and SGS.

Each memory cell MC includes the charge accumulation layer CA provided on the silicon substrate 10 via a tunnel gate dielectric film 15 and the control gate CG provided on the charge accumulation layer CA via an ILD (Inter-Layer Dielectric) film 20. Because the control gate CG is connected to the word line WL or the control gate CG itself functions as the word line WL, the control gate CG is also referred to as "word line WL".

Gate electrodes of the selection gate transistors SGD and SGS are constituted by the same material as that of the charge accumulation layer CA and the control gate CG of each memory cell MC. However, a part of the ILD film 20 between the charge accumulation layer CA and the control gate CG is removed and the charge accumulation layer CA and the control gate CG are electrically connected to each other.

The selection gate transistors SGD and SGS are respectively connected to the ends of each of the NAND strings NS in the memory cell array MCA, and provided to selectively connect one of the NAND strings NS and the memory cells MC to the bit line BL or the source line SL shown in FIG. 1 from among those in the memory cell array MCA.

Each charge accumulation layer CA is voltage-controlled by one word line WL, whereby the charge accumulation layer CA can capture electric charges (electrons, for example) via the tunnel gate dielectric film 15 and accumulate the electric charges therein. Conversely, the charge accumulation layer CA can discharge electric charges (electrons, for example) via the tunnel gate dielectric film 15.

Dummy cells DC are provided between the selection gate transistor SGD or SGS and the memory cells MC. Although each of the dummy cells DC can operate similarly to unselected memory cells MC, the dummy cell DC does not store data therein. Accordingly, during a data write operation and a data read operation, the dummy cell DC is not selected for writing or reading data although the dummy cell DC is conductive. For this reason, the circuit diagram of FIG. 1 does not show the dummy cells DC.

A metal layer ML is provided on the control gates CG of the memory cells MC, control gates CGd of the dummy cells DC, and gate electrodes SG of the selection gate transistors SGD and SGS. The metal layer ML is formed by using low-resistance metal such as tungsten, for example. The metal layer ML is provided to reduce gate resistances of the memory cells MC, the dummy cells DC, and the selection gate transistors SGD and SGS. Although the memory cells MC are downscaled, it is possible to suppress resistances of the word lines WL to be low by providing the metal layer ML.

In the column direction, the control gates CG or the charge accumulation layers CA (hereinafter, also simply "gate electrodes CG or CA") of the memory cells MC are arranged at an interval of a pitch P1. In the column direction, a distance between the control gate CGd or a charge accumulation layer CAd (hereinafter, also simply "gate electrode CGd or CAd") of each dummy cell DC and the gate electrode CG or CA of each memory cell MC on each of the ends of the memory cell array MCA is substantially equal to the pitch P1. A distance between the gate electrode CGd or CGd of the dummy cell DC and the gate electrode SG of each selection gate transistor SGD (or SGS) is also substantially equal to the pitch P1. That is, the gate electrodes CG and CA of the memory cells MC, the gate electrodes CGd and CAd of the dummy cells DC, and the gate electrodes SG of the selection gate transistors SGD (or SGS) are arranged at equal pitches (P1).

In the process of manufacturing a semiconductor device, the sidewall transfer method may be used so as to form patterns of a size equal to or smaller than a minimum processing size F (Feature size) according to the lithography technique. The sidewall transfer method can form patterns having half or less pitches of those of the minimum processing size F according to the lithography technique.

While a hard mask on the gate electrodes CG and CA of the memory cells MC are processed by using a sidewall as a mask according to the sidewall transfer method, a hard mask on the gate electrodes SG of the selection gate transistors SGD and SGS may be processed by using a resist film according to the lithography technique as a mask. In this case, the sidewall used in the sidewall transfer method has half-pitch patterns as described above. Therefore, it is necessary to design the distance between the gate electrode CG or CA of each of the memory cells MC and the gate electrode SG of each of the selection gate transistors SGD or SGS longer than that between the gate electrodes CG or CA of the memory cells MC so as to secure an alignment margin according to the lithography technique. That is, following the progress of downscaling, it is necessary to make the distance between the selection gate transistor SGD or SGS and the memory cell MC longer than the pitch between the memory cells MC adjacent to each other.

On the other hand, if the distance between the selection gate transistor SGD or SGS and the memory cell MC is long, the substrate gouging tends to occur on the semiconductor substrate between the selection gate transistor SGD or SGS and the memory cell MC as already described above.

As described later, in the present embodiment, by using sacrificial films and sacrificial spacers, the distance between the selection gate transistor SGD or SGS and the memory cell MC or the dummy cell DC can be set substantially equal to the pitch P1 between the memory cells MC adjacent to each other, and the alignment margin according to the lithography technique can be secured. It is possible to suppress the substrate gouging at the time of processing the gate electrodes by setting the distance between the selection gate transistor SGD or SGS and the memory cell MC to be substantially equal to the pitch P1 between the memory cells MC.

FIGS. 3 to 13 are cross-sectional views showing an example of a manufacturing method of the NAND flash EEPROM according to the present embodiment. Cross-sections of FIGS. 3 to 13 are those in the column direction along one active area AA and one bit line BL. Furthermore, the cross-sections of FIGS. 3 to 13 show the selection gate transistor SGD (or SGS) as well as the dummy cells DC and the memory cells MC around the selection gate transistor SGD (or SGS). FIGS. 6 to 13 show cross-sections of a hard mask 30 and upper layers than the hard mask 30.

Figure 3:
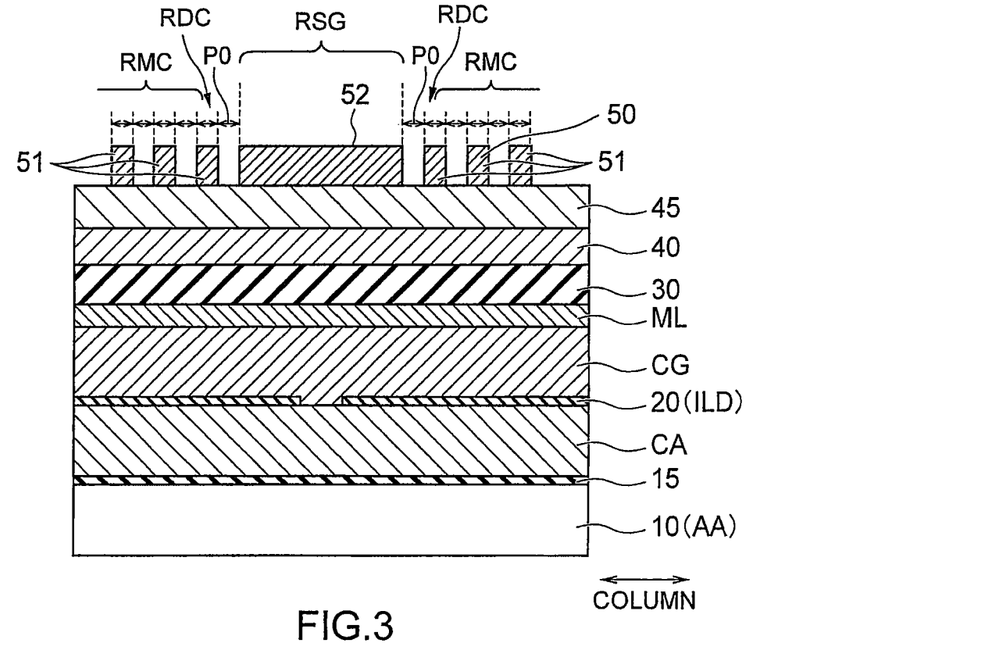
FIGS. 3 to 13 are cross-sectional views showing an example of a manufacturing method of the NAND flash EEPROM according to the present embodiment.

First, the tunnel gate dielectric film 15 is formed on the silicon substrate 10. For example, a silicon oxide film is used for the tunnel gate dielectric film 15 and the tunnel gate dielectric film 15 is formed by oxidizing the silicon substrate 10. The material of the charge accumulation layer CA is deposited on the tunnel gate dielectric film 15. The material of the charge accumulation layer CA is formed by using, for example, polysilicon or a multilayer film of polysilicon and a silicon nitride film. Although not shown in the drawings, in order to isolate the active areas AA, element isolation regions (STI (Shallow Trench Isolation) are formed. The ILD film 20 is deposited on the charge accumulation layer CA, and a part of the ILD film 20 provided in regions in which the selection gate transistors SGS or SGD are formed are removed (only one region is shown in FIG. 3 for brevity). For example, the ILD film 20 is an insulating film such as a silicon oxide film, a silicon nitride film, or a High-k film. The material of the control gate CG is deposited on the ILD film 20. For example, the material of the control gate CG is a conductive film such as doped polysilicon. The metal layer ML is then formed on the control gate CG. For example, the metal layer ML is formed by using low-resistance metal such as tungsten. In this way, the materials of the charge accumulation layer CA, the control gate CG, and the metal layer ML are deposited above the silicon substrate 10 as gate electrode materials.

As for the selection gate transistor SGS or SGD, the material of the control gate CG is deposited on the material of the charge accumulation layer CA in the region in which the ILD film 20 is removed. Therefore, the control gate CG is electrically connected to the charge accumulation layer CA.

The material of the hard mask 30 is then deposited on the metal layer ML. The material of the hard mask 30 is formed by using, for example, an insulating film such as a silicon oxide film or a silicon nitride film. The material of a mandrel 40 for forming sidewall masks is deposited on the hard mask 30. The material of the mandrel 40 suffices to be a material that can selectively etch the hard mask 30, and is formed by using, for example, a silicon oxide film, a silicon nitride film, or polysilicon.

The material of a mandrel 45 for forming sidewall films is then deposited on the material of the mandrel 40. The material of the mandrel 45 suffices to be a material that can selectively etch the mandrel 40, and is formed by using, for example, a silicon oxide film, a silicon nitride film, polysilicon, or a carbon film.

A resist film 50 is further formed on the material of the mandrel 45 by the use of the lithography technique. The structure shown in FIG. 3 is thereby obtained. In this case, the resist film 50 in memory cell regions RMC and dummy cell regions RDC is referred to as "resist film 51" and that in selection gate regions RSG is referred to as "resist film 52". A width of each resist film 51 and a distance between the adjacent resist films 51 in the column direction are P0. A distance between the resist films 51 and 52 in the column direction is also P0. A pitch P0 is a distance equal to or larger than 2F in view of resolution in the lithography technique. If the pitch P0 is equal to or larger than 2F, it suffices to execute the sidewall transfer method a plurality of times so as to set the pitch between the memory cells MC adjacent to each other and the pitch P1 between each selection gate transistor SGD or SGS and each memory cell MC to be equal to or smaller than a half pitch (F/2). For example, the sidewall transfer method is executed twice (sidewall double patterning) so as to change the pitch P0 of 2F to the pitch P1 of the half pitch (F/2).

Figure 4:
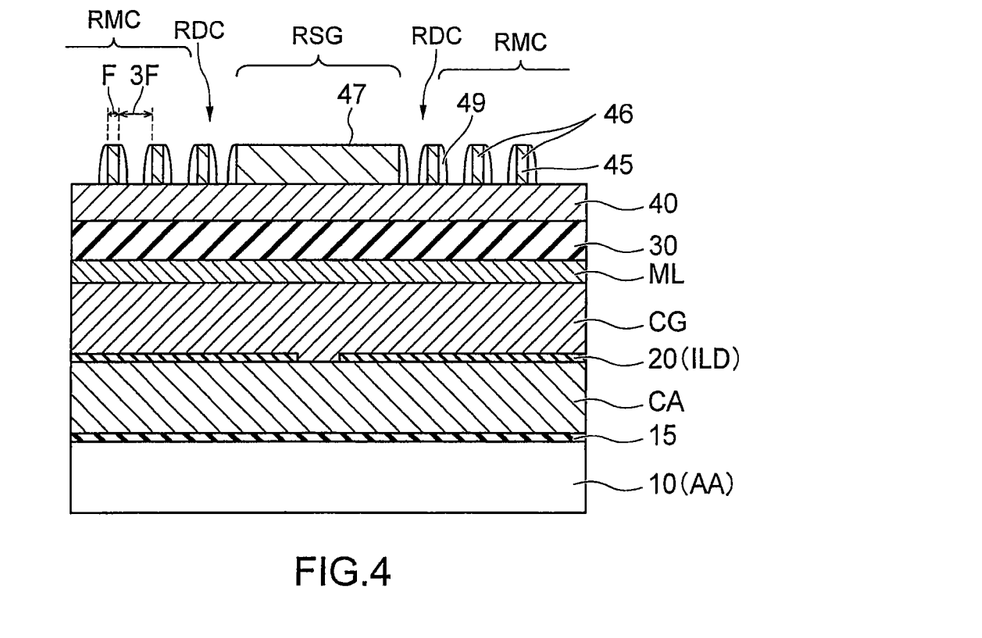

More specifically, by using the resist film 50 as a mask, the material of the mandrel 45 is processed (slimmed) by the RIE (Reactive Ion Etching) method. The slimming process is a process of etching a side surface of the material by either the RIE method or wet etching. By slimming the mandrel 45, a width of each mandrel 45 is set substantially equal to F. As shown in FIG. 4, a distance between the adjacent mandrels 45 is thereby set to 3F. That is, a line width of each mandrel 45 and a space width between the mandrels 45 are F and 3F, respectively.

The mandrels 45 in the memory cell regions RMC and the dummy cell regions RDC are referred to as "mandrels 46" and those in the selection gate regions RSG are referred to as "mandrels 47". A width of each mandrel 46 in the column direction is F and a distance between the adjacent mandrels 46 is 3F. A distance between the mandrels 46 and 47 is also 3F. The mandrels 47 in the selection gate regions RSG are formed wider than 3F.

The material of a sidewall film 49 is deposited on the mandrels 46, 47, and 40, and then etched back by the use of the RIE method until upper surfaces of the mandrels 46 and 47 are exposed. The sidewall film 49 is thereby formed on a side surface of each mandrel 45, as shown in FIG. 4.

Figure 5:
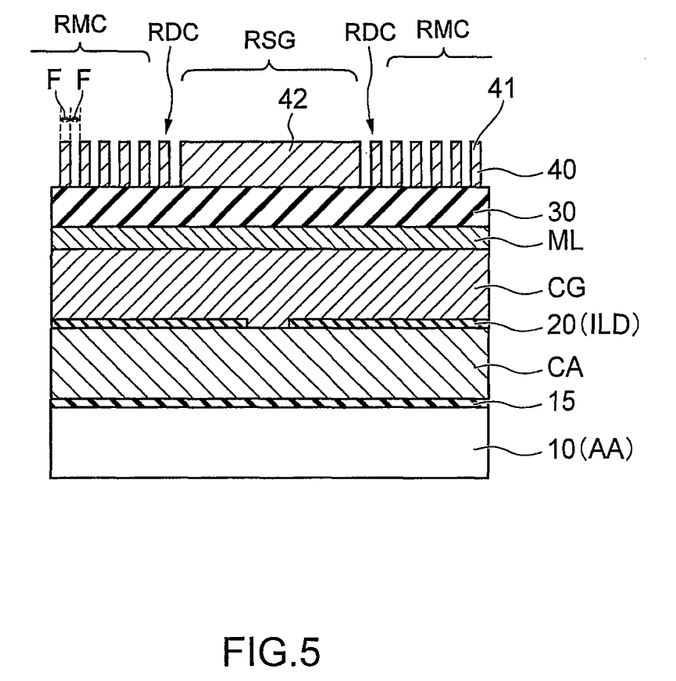

After removing the mandrels 45, the material of the mandrel 40 is processed by the RIE method by using the sidewall films 49 as a mask. As shown in FIG. 5, first mandrels 41 are thereby formed on the material of the hard mask 30 in the memory cell regions RMC and the dummy cell regions RDC, and second mandrels 42 are thereby formed on the material of the hard mask 30 in the selection gate regions RSG. The mandrels 40 in the memory cell regions RMC and the dummy cell regions RDC are referred to as the "first mandrels 41", and those in the selection gate regions RSG are referred to as the "second mandrels 42". A line width of each first mandrel 41 and a space width between the first mandrels 41 are both F. A space width between the first mandrel 41 and the second mandrel 42 is also F.

By slimming the mandrels 41 and 42, the width of each first mandrel 41 is set substantially equal to F/2 (half pitch). The width of the first mandrel 41 in the column direction is thereby F/2 and a distance between the adjacent first mandrels 41 is (3/2)F. That is, the line width of the first mandrel 41 and the space width between the first mandrels 41 are F/2 and (3/2)F, respectively. The distance between the first mandrel 41 and the second mandrel 42 in the column direction is also (3/2)F. The second mandrel 42 in each selection gate region RSG has a width that is substantially identical to that of the mandrel 47 shown in FIG. 4.

Figure 6:
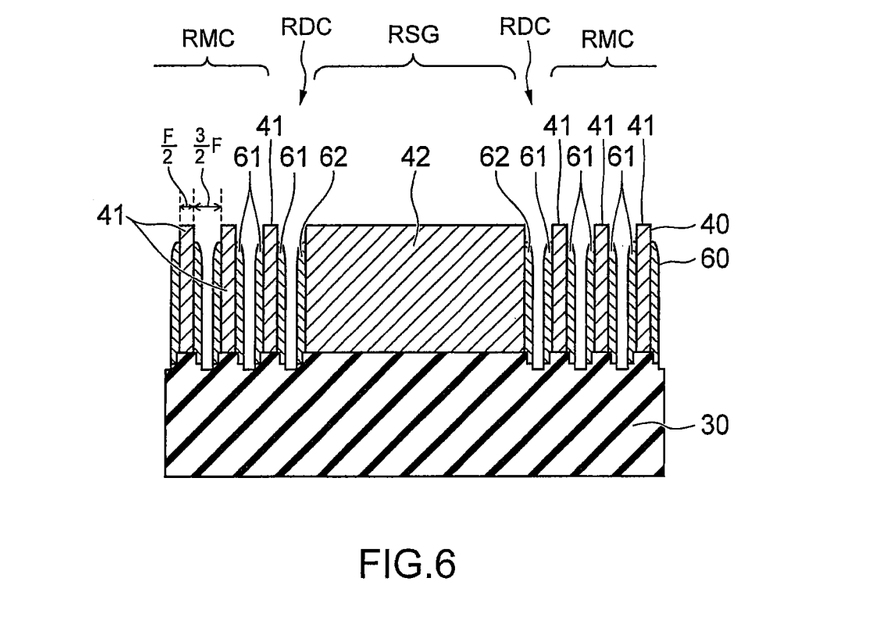

Next, the material of a sidewall mask 60 is deposited on the first mandrels 41, the second mandrels 42, and the hard mask 30 by the use of a CVD (Chemical Vapor Deposition) method. Then, the material of a sidewall mask 60 is etched back by the use of the RIE method until upper surfaces of the mandrels 41 and 42 are exposed. A first sidewall mask 61 and a second sidewall mask 62 are thereby formed on side surfaces of each first mandrel 41 and those of each second mandrel 42, respectively, as shown in FIG. 6.

The material of the sidewall mask 60 is formed by using, for example, a silicon oxide film, a silicon nitride film, or polysilicon, so that the mandrels 40 and the hard mask 30 can be selectively etched by using the sidewall mask 60. The thickness of the material of the sidewall mask 60 is about (1/2)F.

The first sidewall mask 61 is formed into layout patterns of the gate electrodes CG and CA of the memory cells MC. The second sidewall mask 62 and each second mandrel 42 are formed into a layout pattern of the gate electrode SG of the selection gate transistor SGD or SGS. The sidewall mask 60 formed on the side surface of each first mandrel 41 is referred to as "first sidewall mask 61" and that formed on the side surface of each second mandrel 42 is hereinafter referred to as "second sidewall mask 62".

Figure 7:
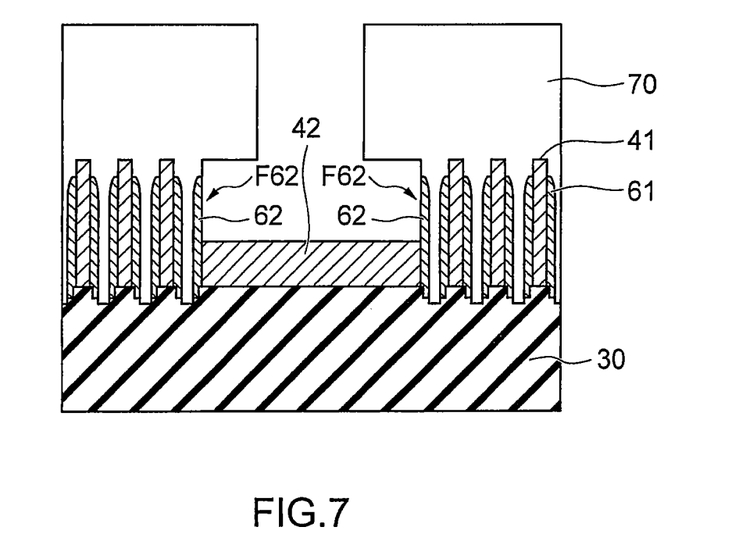

A resist film 70 is formed so as to expose at least a part of upper surfaces of the second mandrels 42 by the use of the lithography technique. As shown in FIG. 7, an upper portion of the second mandrel 42 is selectively etched by the use of either the CDE method or the wet etching, thereby exposing an upper side surface F62 of the second sidewall mask 62.

Figure 8:
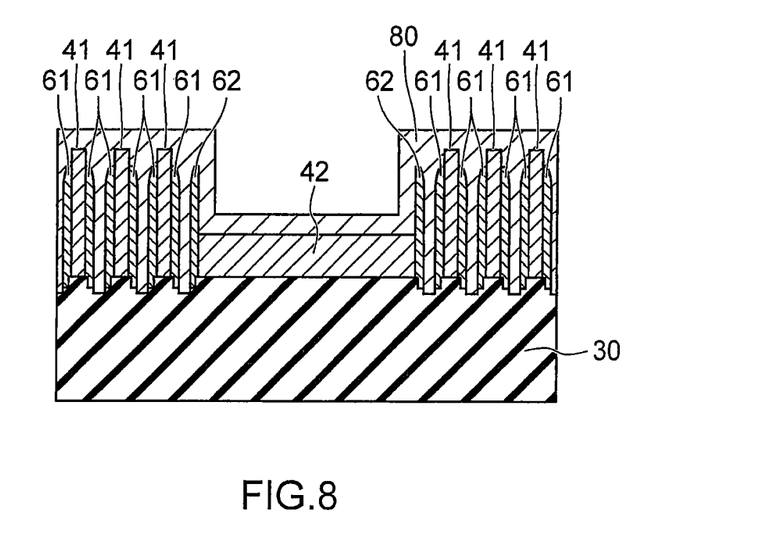

After removing the resist film 70, the material of a sacrificial film 80 is deposited on the first and second sidewall masks 61 and 62 and the first and second mandrels 41 and 42 by the use of the CVD method, as shown in FIG. 8. The sacrificial film 80 is formed continuously from side surfaces of the second sidewall masks 62 to the upper surface of the second mandrel 42 between the second sidewall masks 62. The sacrificial film 80 is also embedded in gaps between the adjacent sidewall masks 61 and in gaps between the first sidewall masks 61 and the second sidewall masks 62. The material of the sacrificial film 80 needs to be a material by which the first mandrels 41 can be selectively removed and which can be selectively removed with respect to the first and second sidewall masks 61 and 62. The material of the sacrificial film 80 is formed by using amorphous silicon, for example. The thickness of the sacrificial film 80 is smaller than half a distance between the second sidewall masks 62 adjacent to each other and larger than half a distance between the first sidewall masks 61.

Figure 9:
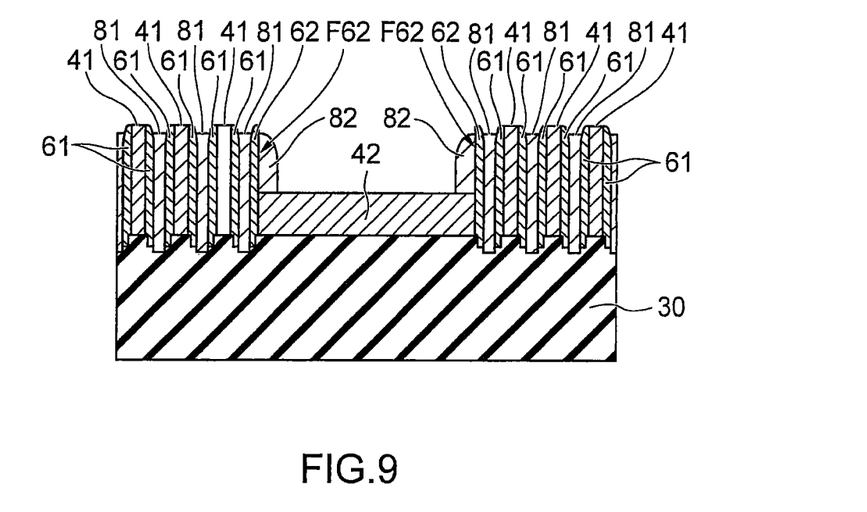

The material of the sacrificial film 80 is etched back by the use of the RIE method until upper surfaces of the first and second mandrels 41 and 42 and the first and second sidewall masks 61 and 62 are exposed. Sacrificial films 81 are thereby embedded in gaps between the adjacent first sidewall masks 61 and sacrificial spacers 82 are thereby formed on the upper side surfaces F62 of the second sidewall masks 62, respectively. The sacrificial films 81 are also embedded in gaps between the first sidewall masks 61 and the second sidewall masks 62.

Figure 10:
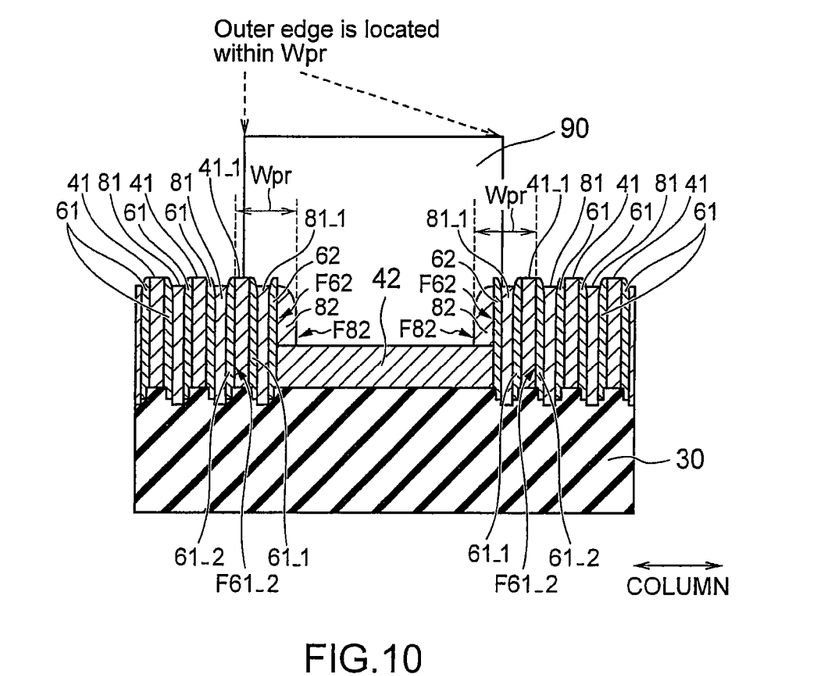

Next, as shown in FIG. 10, a resist film 90 is formed by the use of the lithography technique. The resist film 90 covers each of the second mandrels 42. An outer edge of the resist film 90 in the column direction is located on any one of the constituent elements between a first mandrel 41_1 closest to the second mandrel 42 and the sacrificial spacer 82. That is, the outer edge of the resist film 90 is located on one of the first mandrel 41_1, a first sidewall mask 61_1, a sacrificial film 81_1, the second sidewall mask 62, and the sacrificial spacer 82 between the first mandrel 41_1 and the sacrificial spacer 82. That is, the outer edge of the resist film 90 is between a side surface F61_2 on a second-mandrel-42 side of a first sidewall mask 61_2 that is second closest to the second mandrel 42 and a side surface F82 of the sacrificial spacer 82 opposite to a side surface facing the second sidewall mask 62. That is, the outer edge of the resist film 90 is between the side surfaces F61_2 and F82. A width Wpr between the side surfaces F61_2 and F82 indicates an alignment margin of the resist film 90 in a lithography process. In the present embodiment, the width Wpr is extended to be equal to or larger than F2 by providing the sacrificial films 81 and the sacrificial spacers 82. With this configuration, even if the resist film 90 is misaligned to some extent, the gate electrodes of the memory cells MC and the selection gate transistors SGD and SGS can be processed with high accuracy.

Figure 11:
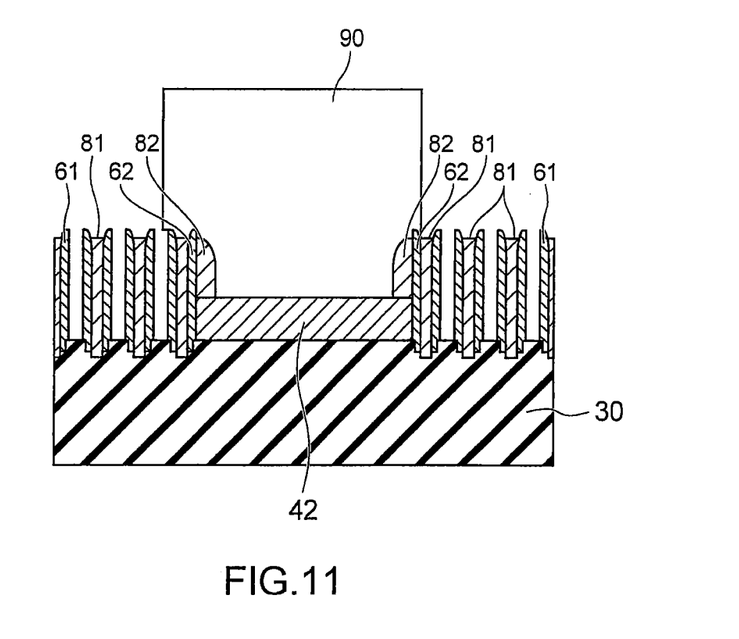

Next, by using the resist film 90 as a mask, the first mandrels 41 are removed by either the RIE method or the wet etching. The structure shown in FIG. 11 is thereby obtained. In this step, the first mandrels 41 are selectively etched with respect to the sacrificial films 81, the sacrificial spacers 82, and the first sidewall masks 61. That is, the material of the first mandrel 41 can be said to differ from those of the sacrificial films 81, the sacrificial spacers 82, and the first sidewall masks 61. Moreover, even when the resist film 90 is present on the first mandrel 41_1 closest to the second mandrel 42, the first mandrel 41_1 can be removed as long as at least a part of an upper surface of the first mandrel 41_1 is exposed. Therefore, it can be said that the outer edge of the resist film 90 suffices to be located between the side surfaces F61_2 and F82, as described above.

Figure 12:
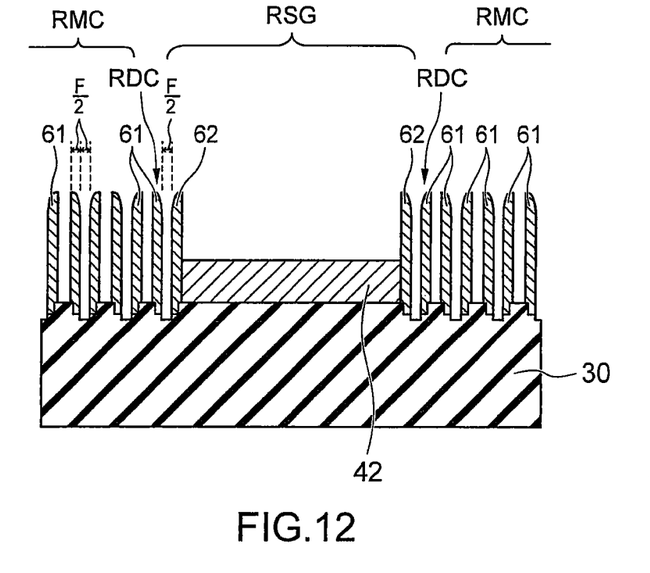

After removing the resist film 90 by the use of either a sulfuric-acid aqueous solution or ashing, the sacrificial films 81 and the sacrificial spacers 82 are selectively etched by the use of the RIE method, the wet etching, or the ashing. As shown in FIG. 12, the first and second sidewall masks 61 and 62 and the second mandrels 42 are thereby left. The second sidewall masks 62 and the second mandrels 42 are formed into the layout pattern of the gate electrode SG of the selection gate transistor SGD or SGS. The first sidewall masks 61 are formed into layout patterns of the gate electrodes CG and CA of the memory cells MC and the gate electrodes CGd and CAd of the dummy cells DC. The distance between one first sidewall mask 61 and one second sidewall mask 62 is substantially equal to that between the adjacent first sidewall masks 61. The distance between the first sidewall mask 61 and the second sidewall mask 62 and that between the adjacent first sidewall masks 61 are substantially equal to half the minimum processing size F. By further repeating the sidewall transfer method, the distance between the first sidewall mask 61 and the second sidewall mask 62 and that between the adjacent first sidewall masks 61 can be set to be smaller than half the minimum processing size F (F/4 or F/8, for example).

Figure 13:
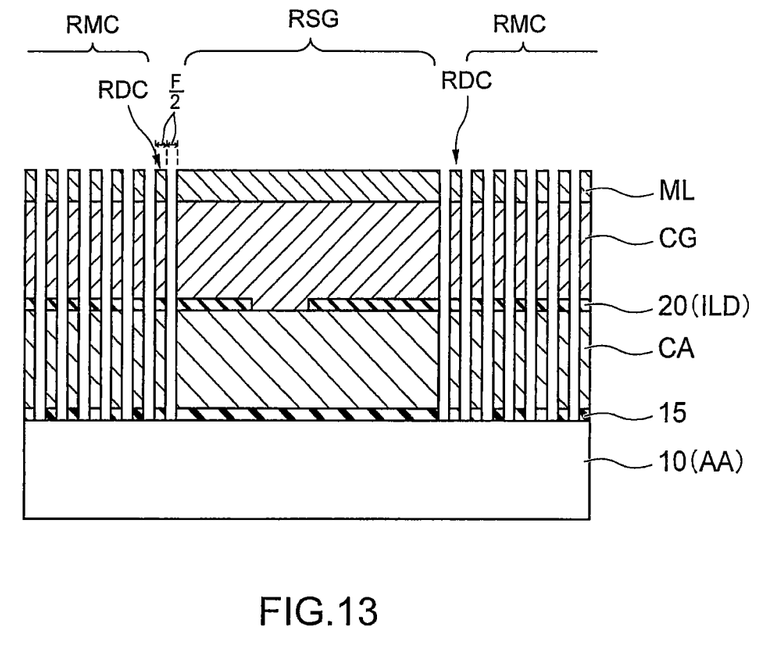

By using the first and second sidewall masks 61 and 62 and the second mandrels 42 as a mask, the hard mask 30 is processed by the RIE method. Furthermore, by using the hard mask 30 as a mask, the materials of the metal layer ML, the control gate CG, the ILD film 20, and the charge accumulation layer CA are processed by the RIE method. The gate electrodes of the memory cells MC, the dummy cells DC, and the selection gate transistors SGD or SGS are thereby formed as shown in FIG. 13. In this case, the substrate gouging can be suppressed because the distance between the first side wall mask 61 and the second sidewall mask 62 and that between the adjacent first sidewall mask 61 are substantially equal to half the minimum processing size F (half pitch). Although scale sizes of the constituent elements shown in FIG. 2 do not match those shown in FIG. 13, FIGS. 2 and 13 show the same memory.

The hard mask 30 is transferred to the metal layer ML, the control gates CG, the ILD films 20, and the charge accumulation layers CA. Therefore, the pitch P1 between the gate electrodes of the memory cells MC, the dummy cells DC, or the selection gate transistors SGD or SGS is substantially equal to half the minimum processing size F (half pitch).

Furthermore, a part of the metal layer ML, the control gates CG, the ILD films 20, and the charge accumulation layers CA in the selection gate regions RSG are etched by a well-known lithography method in order to form regions for forming contacts. Thereafter, by using the gate electrode materials ML, CG, and CA as a mask, impurities are implanted into the active areas AA in order to form source layers and drain layers. Subsequently, inter-layer dielectric films, contacts, metal wirings, and the like are formed in order to form a multilayer wiring structure. The NAND flash EEPROM shown in FIG. 2 is thereby completed.

According to the present embodiment, the gate electrodes of the memory cells MC, the dummy cells DC, and the selection gate transistors SGD and SGS are arranged at an interval of the distance substantially equal to half the minimum processing size F (an interval of half pitches). Therefore, the silicon substrate 10 between the memory cells MC or the dummy cells DC and the selection gate transistor SGD or SGS is not gouged at the time of processing the gate electrode materials ML, CG, and CA. That is, according to the present embodiment, the substrate gouging can be suppressed. By suppressing the substrate gouging, the resistances of the diffusion layers between the memory cells MC or the dummy cells DC and the selection gate transistor SGD or SGS can be suppressed from increasing. Therefore, it is possible to suppress a cell current from decreasing.

In the present embodiment, the sacrificial films 81 are embedded in the gaps between the first sidewall masks 61 adjacent to each other, and the sacrificial spacers 82 are respectively formed on the upper side surfaces F62 of the second sidewall masks 62 as shown in FIG. 9. This can extend the alignment margin Wpr of the resist film 90 shown in FIG. 11. Therefore, it is possible to make alignment in the lithography process shown in FIG. 11 relatively easily although the gate electrodes of the memory cells MC, the dummy cells DC, and the selection gate transistors SGD and SGS are arranged at half pitches.

Furthermore, the half-pitch arrangement of the gate electrodes of the memory cells MC, the dummy cells DC, and the selection gate transistors SGD and SGS can reduce a memory chip size as compared with the conventional technique.

Further, in the present embodiment, the sidewall transfer method is executed a plurality of times. Accordingly, in an initial lithography process of processing the gate electrodes shown in FIG. 3, the resist films 50 can be formed at the line width and space width twice or more as large as the minimum processing size F.

Normally, non-periodic patterns such as those of the memory cells MC and the selection gate transistors SGD, SGS are inferior in resolution to periodic patterns such as those of the gate electrodes in the memory cell array. Accordingly, if the line width or space width of the resist films 50 is made to be equal to or smaller than the minimum processing size F by the use of the lithography technique, exposure defects possibly occur between the selection gate transistors SGD or SGS and the memory cells MC.

On the other hand, in the present embodiment, the resist films 50 are formed at the line width and the space width twice or more as large as the minimum processing size F. Therefore, it is possible to suppress occurrence of exposure defects between the selection gate transistors SGD or SGS and the memory cells MC.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor storage device, the device comprising: a plurality of memory cells; and a selection gate transistor provided on each end of a memory cell array including the memory cells, the method comprising:
    depositing a gate electrode material of the memory cells and of the selection gate transistor above a semiconductor substrate;
    depositing a hard mask material on the gate electrode material;
    forming first mandrels on the hard mask material in a region of the memory cell array, and forming a second mandrel on the hard mask material in a region of the selection gate transistor;
    forming first sidewall masks on side surfaces of the respective first mandrels in order to form the first sidewall masks into patterns of gate electrodes of the memory cells, and forming a second sidewall mask on a side surface of the second mandrel in order to form the second sidewall mask on a part of a gate electrode of the selection gate transistor;
    removing an upper portion of the second mandrel in order to expose an upper side surface of the second sidewall mask;
    embedding a sacrificial film in a gap between the first sidewall masks adjacent to each other, and forming a sacrificial spacer on the upper side surface of the second sidewall mask;
    forming a resist film covering the second mandrel, an outer edge of the resist film being located in a region between one of the first mandrels closest to the second mandrel and the sacrificial spacer;
    removing the first mandrels by using the resist film as a mask; and
    removing the sacrificial film and the sacrificial spacer.

2. The method of claim 1, wherein the outer edge of the resist film is located on any one of the first mandrel closest to the second mandrel, the first sidewall mask, the sacrificial film, the second sidewall mask, and the sacrificial spacer which are between the first mandrel closest to the second mandrel and the sacrificial spacer.

3. The method of claim 1, wherein the outer edge of the resist film is located between a side surface of the first sidewall mask being second closest to the second mandrel and a side surface of the sacrificial spacer, the side surface of the first sidewall mask faces to the second mandrel, the side surface of the sacrificial spacer is located on opposite side to a side surface of the sacrificial spacer facing the second sidewall mask.

4. The method of claim 2, wherein the outer edge of the resist film is located between a side surface of the first sidewall mask being second closest to the second mandrel and a side surface of the sacrificial spacer, the side surface of the first sidewall mask faces to the second mandrel, the side surface of the sacrificial spacer is located on opposite side to a side surface of the sacrificial spacer facing the second sidewall mask.

5. The method of claim 1, wherein a distance between one of the first sidewall masks closest to the second mandrel and the second sidewall mask is substantially equal to a distance between the first sidewall masks adjacent to each other.

6. The method of claim 1, wherein a distance between one of the first sidewall masks closest to the second mandrel and the second sidewall mask and a distance between the first sidewall masks adjacent to each other are equal to or smaller than half a minimum processing size according to a lithography technique.

7. The method of claim 1, wherein the gate electrode is a control gate of a NAND flash EEPROM or a charge accumulation layer of the NAND flash EEPROM.

8. The method of claim 1, wherein material of the first mandrels and material of the sacrificial spacer are different from each other.

9. The method of claim 1, wherein in a column direction, thickness of the sacrificial spacer is smaller than half a distance between the second sidewall masks and larger than half a distance between the first sidewall masks.

* * * * *